(12) United States Patent
Jäger et al.

(10) Patent No.: US 7,951,352 B2
(45) Date of Patent: May 31, 2011

(54) METHOD FOR THE PRODUCTION OF ALPHA-CALCIUM SULFATE HEMIHYDRATE FROM CALCIUM SULFATE DIHYDRATE

(75) Inventors: Reinhard Jäger, Bad Hersfeld (DE); Alfred Brosig, Salzgitter (DE)

(73) Assignee: Grenzebach-BSH GmbH, Bad Hersfeld (DE)

( * ) Notice: Subject to any disclaimer, the term of this patent is extended or adjusted under 35 U.S.C. 154(b) by 0 days.

(21) Appl. No.: 12/601,033

(22) PCT Filed: May 20, 2008

(86) PCT No.: PCT/DE2008/000854
§ 371 (c)(1),
(2), (4) Date: Nov. 20, 2009

(87) PCT Pub. No.: WO2008/141627
PCT Pub. Date: Nov. 27, 2008

(65) Prior Publication Data
US 2010/0166640 A1 Jul. 1, 2010

(30) Foreign Application Priority Data
May 24, 2007 (DE) .......................... 10 2007 024 188

(51) Int. Cl.
*C01F 11/46* (2006.01)
(52) U.S. Cl. ........................................ 423/555; 106/772
(58) Field of Classification Search .................. 423/555; 106/772
See application file for complete search history.

(56) References Cited

U.S. PATENT DOCUMENTS

| 1,979,704 A | 11/1934 | Randel et al. |
| 5,041,333 A * | 8/1991 | Conroy ........................ 428/312.4 |
| 5,320,677 A * | 6/1994 | Baig .............................. 106/780 |

FOREIGN PATENT DOCUMENTS

| DE | 344478 | 11/1921 |
| DE | 937276 | 12/1955 |
| DE | 952967 | 11/1956 |
| EP | 0572781 | 9/1996 |
| GB | 1 224 149 | 3/1971 |
| GB | 1224149 | 3/1971 |

\* cited by examiner

*Primary Examiner* — Timothy C Vanoy
(74) *Attorney, Agent, or Firm* — Duane Morris LLP; J. Rodman Steele, Jr.; Gregory M. Lefkowitz

(57) ABSTRACT

Disclosed is a method for producing alpha-calcium sulfate hemihydrate from calcium dihydrate. Said method has the following features: a) calcium dihydrate is fed to an agitated autoclave (1); b) the agitated autoclave (1) is indirectly heated; c) water is added and incorporated in a controlled manner; d) the feedstock is prevented from adhering to surfaces of the reaction chamber by means of moved chains (3) that are mounted on the paddles and/or the drive shaft (16) of the agitated autoclave (1); e) the pressure in the reaction chamber is regulated at intervals or in a continuous manner by discharging vapor when a certain pressure has been reached in the interior, the vapor being conducted via a centrifugal separator (17) and a control valve (18); f) cold air is delivered for residual drying purposes; g) the process material is removed. Also disclosed is a corresponding apparatus for carrying out said method.

13 Claims, 2 Drawing Sheets

METHOD FOR THE PRODUCTION OF ALPHA-CALCIUM SULFATE HEMIHYDRATE FROM CALCIUM SULFATE DIHYDRATE

CROSS-REFERENCE TO RELATED APPLICATIONS

This application is a §371 national stage entry of International Application No. PCT/DE2008/000854, filed May 20, 2008, which claims priority to German Patent Application No. 10 2007 024 188.9, filed May 24, 2007, both of which are hereby incorporated by reference.

BACKGROUND

Gypsum is the mineralogical name for the chemical compound calcium sulfate dihydrate ($CaSO_4 \cdot 2H_2O$).

By supplying thermal energy, gypsum loses 1/1;2molecules from its chemically bound water of crystallization, per formula unit, and the calcium sulfate dihydrate is thereby converted into calcium sulfate hemihydrate $CaSO_4 \cdot 0.5H_2O$.

There are two technical forms of calcium sulfate hemihydrate and these are frequently distinguished, in practice, as alpha and beta modification, even though they are identical in terms of chemico-mineralogy. If the thermal energy is supplied at atmospheric pressure, the beta modification of the calcium sulfate hemihydrate is obtained. The grains of such a fired product have a high inherent porosity and consist of innumerable individual crystallites. On account of the high surface area, a binder comprising this hemihydrate has a high water requirement during processing, and this results in a water-gypsum factor of about 0.6-1.0 (determined via gauging quantity; test according to EN 13279-1; September 2005). This means that low strength values are obtained during processing. Beta modification is the main constituent of plaster of Paris which is greatly important as a binder for the production of gypsum mortar and gypsum plasterboard. The present invention concerns the production of the other form of calcium sulfate hemihydrate, alpha modification.

This alpha modification of the calcium sulfate hemihydrate is produced from supersaturated aqueous solutions, specifically in solutions of electrolytes of acids and salts or at elevated temperature and elevated steam pressure in autoclaves. These conversions are generally carried out using additives which have a desirable influence on the morphology of the crystals which are produced.

In contrast to beta modification, alpha modification provides well-formed individual crystals which, after grinding, produce binders having water-gypsum factors of about 0.3 to 0.5. This results in considerably higher strength values during use. Binders such as these are used, for example, in the dental sector.

If alpha-calcium sulfate hemihydrate crystallizes from aqueous solutions or in electrolyte solutions, use is made of the term "wet process". In wet processes with aqueous solutions, a distinction is made between "neutral" operation and "acidic" operation. Whereas, in neutral operation, roughly pH-neutral gypsums such as natural gypsums or FGD gypsums are converted without setting the pH value (see, e.g., GB 563 019), the pH value is deliberately set to about 2 to 3 using sulfuric acid in acidic operation, where acidic starting gypsums such as phosphogypsum are normally used (DE 11 57 128 A1). If, by contrast, alpha-calcium sulfate hemihydrate is produced in steam-charged autoclaves, use is made of the term "dry process" (see, e.g., U.S. Pat. No. 1,901,051).

The production of alpha-calcium sulfate hemihydrate from electrolyte solutions (U.S. Pat. No. 2,616,128) has not been able to succeed in industry since considerable corrosion occurs on the equipment. In addition, the process-technology steps of dewatering by filtration, filter cake washing and wastewater treatment, which need to be carried out before drying, came across insurmountable difficulties. In addition, instances of material adhesion and encrustation cannot be avoided as a result of set calcium sulfate dihydrate.

In the "dry process", coarse pieces of natural gypsum having a high degree of purity and a compact crystal microstructure are stacked on rack trolleys or in perforated steel baskets and heated in a steam-charged autoclave. In order to achieve a high degree of conversion even in the core region, it is necessary for the gypsum to reside in the pressurized steam atmosphere for a time period of several hours. The same principle is applied for a "dry process" in which firstly finely-divided gypsum is pressed to form stone blanks and is then subjected to the heat treatment described above in pressurized steam (see, e.g., DE 38 19 652 03).

According to DE 0937276 C, DE 4217978 A1 and EP 0572781 B1, a further approach for a dry or semi-dry process provides a horizontal (or else vertical) agitator autoclave. According to DE 093 7276 C, the first water of crystallization which emerges from the gypsum builds up the pressure in the agitator autoclave, if appropriate assisted by water of imbibition which is present (up to about 3%). Granular material is used, and drying can be carried out in the drum.

According to DE 4217978 A1 and EP 0572 781 B1, finely-divided material is converted in the horizontal agitator autoclave without or with a very small addition of water with and without additives. Drying can be carried out in the autoclave or in a downstream apparatus.

Claim 1 of EP 0572 781 B1 claims a process for the production of alpha-calcium sulfate hemihydrate from calcium sulfate dihydrate using the dry process, in which fine granular raw material is charged and converted under the action of pressure, temperature and steam, this process being characterized in that the material is mixed in the interior of a stationary reactor using externally driven mixing devices or in the interior of a rotating reactor using stationary or movable mixing devices, and in that the temperature of the material in the reactor is measured continuously and controlled in accordance with a preselected time curve.

Furthermore, the dependent claims substantially claim that the raw material is charged having a specific proportion of surface moisture and/or having a reduced proportion of water of crystallization, that additives are added, that the pressure is controlled in accordance with a preselected time curve, that steam is withdrawn and air is admixed, and that a separate downstream drying device is provided.

The description also refers to appropriately designed mixing tools which are intended to prevent agglomeration (column 4, lines 15-19). However, a corresponding, detailed disclosure in this respect cannot be found in EP 0572 781 B1.

To date, it has not been possible to successfully operate installations according to this disclosure. A model installation was taken down after two years of test operation due to insurmountable technical difficulties.

The revocation of the corresponding patent came into legal force on Jul. 23, 1998.

SUMMARY OF THE INVENTION

The process according to the invention is therefore based on the object of specifying a process and a device for the production of alpha-calcium sulfate hemihydrate from calcium dihydrate, which shows its effect in a low-cost and technically reliable manner while saving energy.

This object is achieved by means of a process and a device as claimed.

These processes and the corresponding device are described in more detail below.

BRIEF DESCRIPTION OF THE DRAWINGS

In detail.

DETAILED DESCRIPTION

Figure 1:
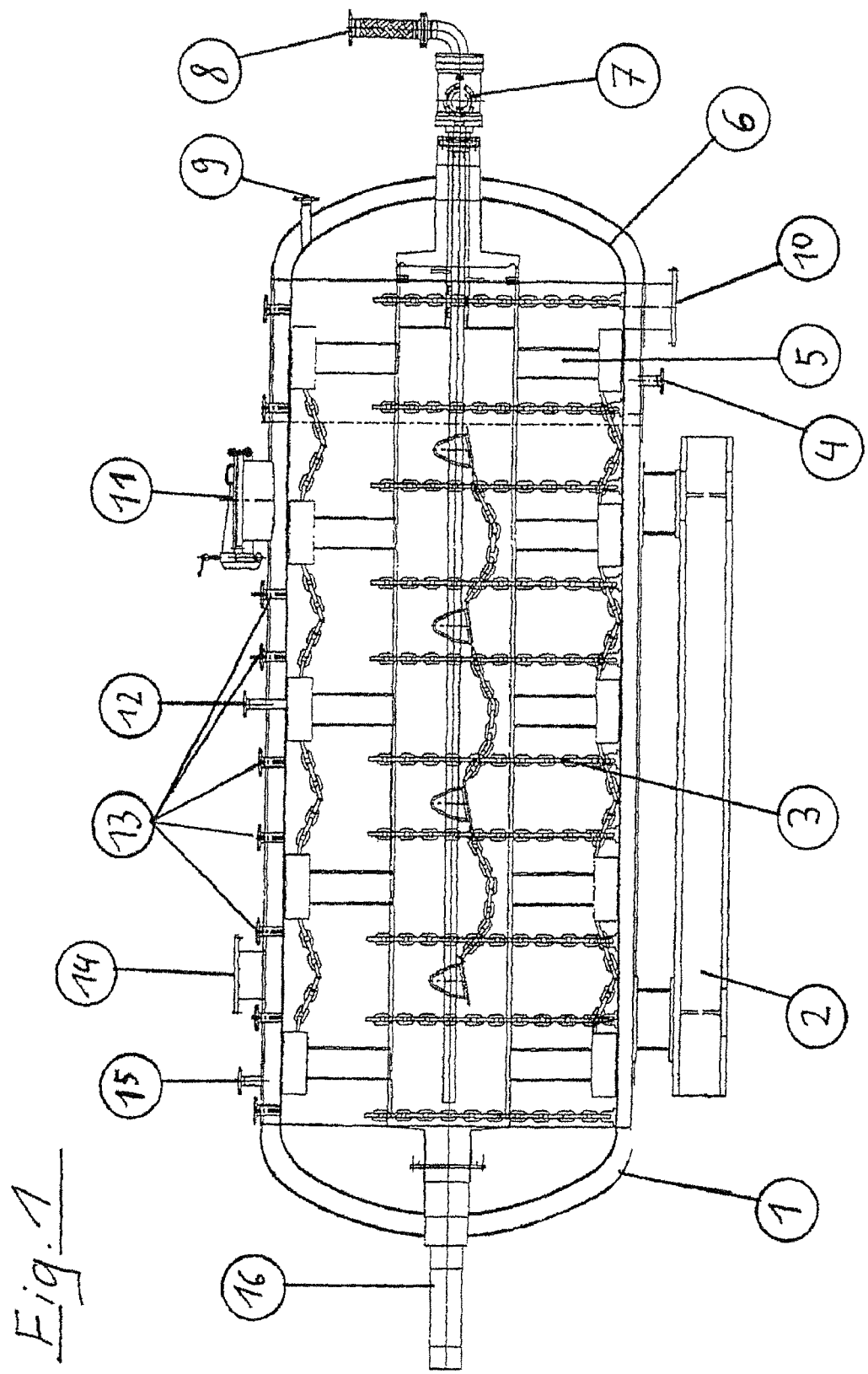
FIG. 1: shows an agitator autoclave according to the invention.

The agitator autoclave (1) on its base frame (2), as shown in FIG. 1, is distinguished primarily in that it has chains (3) which hang in the reaction chamber in the region of the agitator (5).

Here, an indirectly heated, horizontal paddle dryer customary in practice has been modified in such a way that movable steel chains (3) have been fitted between the rotating agitating elements which are driven by the drive shaft (16). These steel chains (3) are in contact with the floor in the lower vertex of the autoclave (1). Weighted steel chains (3) have also been wrapped around the central agitating shaft such that they can move freely between the paddle elements. Gravitational force means that the steel chains always hang vertically downward and strip any build-up of material which forms from the rotating central agitator shaft and from other inner parts of the installation which are sensitive to a build-up of material.

In addition, exposure to ultrasound makes it possible both to promote the homogenization processes and to reduce material adhesion.

Special additional coatings on the inner parts of the installation, which prevent instances of material adhesion and are neutral for the conversion process, have a similar effect.

According to the invention, the effect of the chain elements which strip off the undesirable build-up of material as a result of gravitational force can be increased further by fitting more or less heavy bodies which are provided with edges, such as cubes or similar platonic bodies, instead of or in addition to individual chain elements.

Process heat in the form of steam is supplied via the steam feed (15) between the inner jacket (6) and the outer jacket of the agitator autoclave. The condensate produced here is discharged via the condensate discharge (4).

The central agitator (5) is likewise heated via the steam feed (8), it being possible for the condensate produced to flow away via the condensate outflow (7). According to the invention, however, it is also possible to supply the process heat required via other energy carriers. Conceivable here are solar energy, wind energy or residual heat produced during atomic processes. Electrical energy obtained in any conceivable way can be fed to the components involved in the process primarily via microwaves.

The compressed air required for the process is supplied via the compressed air feed (9). This discharges residual moisture. Since this compressed air is supplied cold, it is able to absorb a large amount of residual moisture after heating.

The raw material is supplied via the raw material inlet (14).

It is generally known that finely particulate solid matter tends to deposit on contact surfaces after water or other liquids have been mixed in. It is therefore impossible for the water required for setting the optimum surface moisture to be mixed in outside the autoclave since the charging of the autoclave with material would stop due to clogging. It is accordingly necessary to spray the water onto the moving calcium sulfate dihydrate which is already in the autoclave.

The water required for the process is therefore fed in via the spray nozzles (13).

After conversion of calcium sulfate dihydrate and crystallization to form alpha-calcium sulfate hemihydrate, the material remains in the autoclave. Furthermore, thermal energy is supplied into the double jacket of the autoclave, while the pressure in the reaction chamber is reduced continuously. As a result, the difference in saturation temperature between the heated double jacket and the reaction chamber increases, and this results in an increased flow of energy and thus in accelerated drying. The drying procedure is finished by briefly blowing compressed air into the reaction chamber. The heated compressed air has great potential for absorbing the residual moisture from the alpha-calcium sulfate hemihydrate.

The absolutely dry alpha-calcium sulfate hemihydrate is emptied from the reaction chamber and can then be taken out from the outlet (10).

The process steam is removed via the opening (12) and it is possible to inspect the installation via the inspection opening (11).

Figure 2:
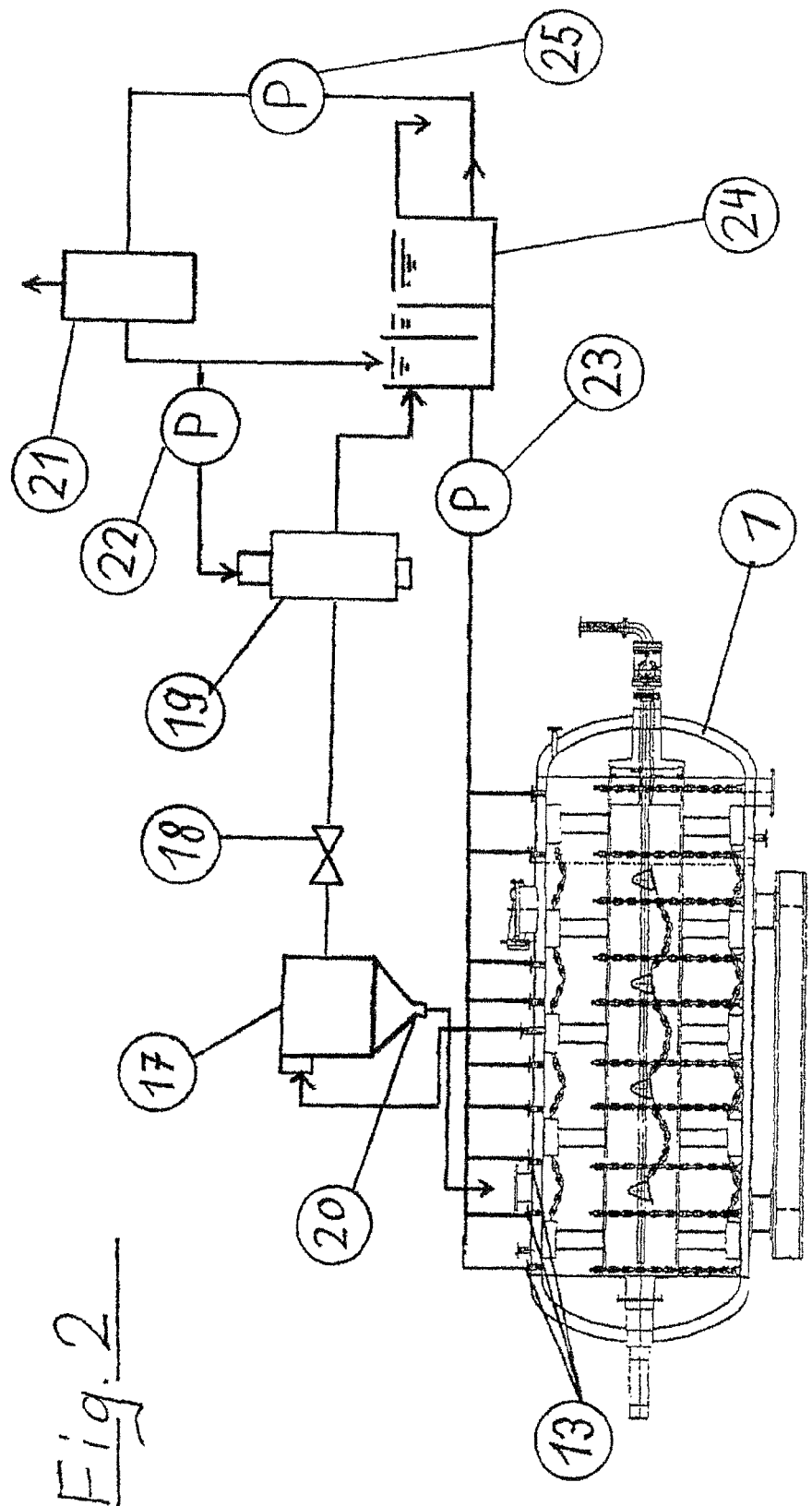
FIG. 2: shows an agitator autoclave according to the invention with peripheral units.

FIG. 2 shows the additional units required for optimum operation of the agitator autoclave according to the invention.

Thus, the process steam outlet (12) leads to a steam cyclone which is indicated by the reference numeral (17) in FIG. 2 and acts as a steam lock.

Cyclones are used in chemistry for the centrifugal separation of dust. Cyclones are a cylindrical apparatus which tapers in the lower region. The crude gas from which dust is to be removed flows from above tangentially into the cyclone and is forced onto a circuit by the cyclone wall. This produces a rotating gas whirl. The concomitantly rotating particles of dust are flung against the wall by the centrifugal force, flocculate to form agglomerates and drop downward on the wall, where they are taken from the cyclone using a star wheel.

The gas whirl moves downward in rotating fashion on the apparatus wall into the narrowing part, reducing its circle diameter in the process. Since it cannot escape from the apparatus at the bottom, it is deflected on the floor of the apparatus and rises in rotating fashion with a reduced diameter to the top, where it leaves the cyclone through the dip pipe.

In the case shown in FIG. 2, the steam cyclone (17) is used to clean the process steam of the dust which is produced. At this stage, this is done with an efficiency of up to 95%. The dust produced in the steam cyclone is usually alpha-calcium sulfate hemihydrate nuclei which can be fed back to the autoclave (1) via the return (20) shown. The remaining dust is then removed using the Venturi scrubber (19) and may likewise be fed to the overall process.

The process water pump (23) supplies the water taken from the water feed (22) into the agitated autoclave (1) via the spray nozzles (13). The water present in the condenser (21) and in the process water cooler (24) is fed back to the process. Process steam is discharged via the control valve (18).

The corresponding courses of the lines are substantially determined by the function.

The addition of additives which influence the crystal growth has not been shown in more detail. It is possible to use all additives which are known for this process from the prior art.

The process according to the invention and the device according to the invention ensure that high-quality alpha-calcium hemihydrate is produced from calcium dihydrate in an operationally reliable manner while saving energy.

The overall efficiency of such an installation can be increased further by simultaneously operating and linking a plurality of devices according to the invention by process technology.

LIST OF REFERENCE NUMERALS (1) Agitator autoclave
(2) Base
(3) Chains
(4) Condensate discharge (jacket heating)
(5) Agitator (heated)
(6) Inner jacket
(7) Condensate outflow (agitator heating)
(8) Steam feed (agitator heating)
(9) Compressed air feed
(10) Outlet of the alpha-calcium sulfate hemihydrate
(11) Inspection opening
(12) Process steam outlet
(13) Spray nozzles
(14) Raw material inlet
(15) Steam feed (jacket heating)
(16) Drive shaft (agitator)
(17) Steam cyclone
(18) Control valve, actuating valve
(19) Venturi scrubber
(20) Alpha nucleus return
(21) Condenser
(22) Water feed
(23) Process water pump
(24) Process water cooler

The invention claimed is:

1. A process for the production of alpha-calcium sulfate hemihydrate from calcium dihydrate, said process comprising the following features:
   a) an agitated autoclave (1) is charged with calcium sulfate dihydrate,
   b) the agitated autoclave (1) is heated indirectly,
   c) water is added and mixed in in a controlled manner,
   d) material is prevented from adhering to surfaces of the reaction chamber by moving chains (3) fitted to the paddles and/or the drive shaft (16) of the agitated autoclave (1),
   e) the pressure in the reaction chamber is regulated at intervals or continuously by discharging steam when a specific pressure has been reached in the interior, the steam being guided via a cyclone separator (17) and an actuating valve (18),
   f) cold air is fed in for residual drying, and
   g) the process material is removed.

2. The process as claimed in claim 1, further comprising:
   a) an addition of nuclei in the form of alpha-calcium sulfate hemihydrate, and
   b) the controlled addition and mixing-in of additives dissolved in water.

3. The process as claimed in claim 1, wherein a Venturi scrubber (19) is connected downstream of the cyclone separator (17).

4. The process as claimed in claim 1, wherein the material deposited in the cyclone separator (17) and/or the Venturi scrubber is reused for the production of alpha-calcium sulfate hemihydrate.

5. The process as claimed in claim 1, wherein the agitated autoclave (1) is charged using ground natural gypsum, flue gas desulfurization gypsum or other finely-divided, synthetic gypsum.

6. The process as claimed in claim 1, wherein the agitated autoclave (1) is heated using fossil energy carriers, solar energy, wind energy or residual atomic heat.

7. The process as claimed in claim 1, wherein nuclei are added to an extent of up to 5% of the mass of the calcium sulfate dihydrate.

8. The process as claimed in claim 1, wherein water is added to an extent of up to 20% of the mass of the calcium sulfate dihydrate.

9. The process as claimed in claim 8, wherein water is added in a controlled manner by introducing it through spray nozzles (13) distributed uniformly or nonuniformly on the circumference of the agitated autoclave (1).

10. The process as claimed in claim 1, wherein a plurality of agitated autoclaves (1) are operated jointly.

11. A device for the production of alpha-calcium sulfate hemihydrate from calcium dihydrate in an agitated autoclave (1), said device comprising the following features:
   a) the agitated autoclave (1) has two walls and is heated indirectly, the means (5) for agitating the charged material being heatable,
   b) spray nozzles (13) distributed on the jacket of the agitated autoclave (1) are designed such that operating means can be introduced through them,
   c) loosely hanging chains (3) are fastened in the region of the agitator (5), and
   d) a cyclone separator (17) and a Venturi scrubber (19) are connected downstream of the agitated autoclave (1).

12. The device as claimed in claim 11, wherein the material deposited in the cyclone separator (17) and the Venturi scrubber (19) is fed back to the agitated autoclave (1).

13. The device as claimed in claim 11, wherein a plurality of autoclaves (1) are operated jointly.

* * * * *